United States Patent [19]

Thompson et al.

[11] Patent Number: 5,046,389
[45] Date of Patent: Sep. 10, 1991

[54] UNIVERSAL PUNCH BLOCK APPARATUS

[75] Inventors: Ted L. Thompson; David R. Hembree, both of Boise, Id.

[73] Assignee: Micron Technology, Inc., Boise, Id.

[21] Appl. No.: 446,785

[22] Filed: Dec. 6, 1989

[51] Int. Cl.⁵ ............................................ F16H 27/02
[52] U.S. Cl. .......................................... 83/140; 83/27; 83/143; 83/164; 83/412; 83/630; 83/639.1; 83/942
[58] Field of Search ................... 83/27, 104, 140, 143, 83/412, 630, 639.1, 164, 906, 942

[56] References Cited

U.S. PATENT DOCUMENTS

3,973,453  8/1976  Tameo ............................... 83/639.1
4,947,716  8/1990  Whistler ............................ 83/639.1

Primary Examiner—W. Donald Bray
Attorney, Agent, or Firm—Robert A. de Groot; Stephen A. Gratton

[57] ABSTRACT

An inspection station punch block apparatus for removing a portion of an integrated circuit die lead from a lead frame. The missing lead is used to mark a defective die and is lataer monitored by a scanning means which causes rejection of the die from the lead frame. A method of carrying out this operation is also disclosed.

15 Claims, 8 Drawing Sheets

UNIVERSAL PUNCH BLOCK APPARATUS

BACKGROUND OF THE INVENTION

This invention relates to improvements in an inspection station apparatus integrated into an integrated circuit (IC) chip manufacturing assembly line. Following a visual inspection of an IC chip, and prior to encapsulation, a machine operator causes the apparatus of the present invention to punch one die frame lead of an IC die as an indication of a defective die which requires subsequent removal (and/or recycling).

A die is an integrated circuit chip composed of silicon, silicon oxides, conducting surfaces, and insulating surfaces bonded to a lead frame and later encapsulated. The punch is activated by an inspector inspecting each IC die as it is indexed forward on its die frame through the inspection machine. The visual inspection of the IC die follows a wire bond procedure which includes the thermocompression bonding of one end of a gold or aluminum lead wire to an aluminum bonding pad on the die, with the other end of the wire being bonded to a lead frame lead. If any defect in the product is noted either in the bond or otherwise, the inspector initiates the punch operation of the present invention and a small section of a lead is removed. As set forth below, only a single lead in each defective IC die is punched. During subsequent processing of the IC die, and generally after encapsulation, an optical sensor scans the package leads for defects. If a missing section of lead wire is noted, the IC package automatically is removed from the assembly line.

The apparatus of the present invention comprises a universal punch block apparatus, and can accommodate the following types of IC devices: single in-line package (SIP), single in-line memory module (SIMM), small outline J leaded (SOJ), plastic leaded chip carriers (PLCC), dual in-line package (DIP) and zig-zag in-line package (ZIP). Commercially available punch block apparatus used by Applicant functioned adequately for their intended purpose, but were characterized by a number of problems, namely:

1. The punches were generally not adaptable to more than one product line, due to lack of adjustment features;
2. The top of a die insert was fixed, creating an interference with certain IC die products;
3. Imprecise punch positioning and uneven operation resulted from the many separate parts comprising the apparatus;
4. A change in product line inspected by such apparatus' often required changing the entire punch block assembly and required siqnificant adjustments to location of die frame indexing devices; and
5. The punch was fixed in relation to the die leads, i.e. only one specific die lead could be punched.

The apparatus of the present invention solves each of these problems with a unique design by a simple exchange of punches, adjustable punch holding devices, moveable die inserts and a rigid single piece base for the apparatus.

SUMMARY OF THE INVENTION

The invention disclosed is a punch block apparatus for removing an IC die lead from a lead frame such that when the absence of the removed IC die lead is noted by scanning means, the IC die is rejected and ultimately removed from the lead frame.

This invention solves the problems set forth above by the following improvements:

1. Multiple, interchangeable cylindrical punches, commercially available, have been adapted to enable the punching of leads in IC packages over an entire product line, i.e. SIP, SIMM, SOJ, PLCC (both side and end leads as discussed below), DIP and ZIP;
2. The die insert of the punch is actuated to an upward position during the punch cycle so as to avoid possible interference with certain IC die products;
3. The back rail of the punch block apparatus is provided in one piece, thereby providing more precise positioning of indexing parts and smoother operation;
4. The adjustments required to accommodate different product lines are simplified due to the incorporation of slotted apertures in the back rail used to mount the die frame indexing devices;
5. The punch assembly can be adjusted to punch more than one specific die lead by the incorporation of slotted apertures in the punch block for the punch mounting devices.
6. The die insert travels up prior to punch downward motion.

The method and apparatus of this invention accomplishes these results as a function of the improvements described herein. It is an object of the present invention to provide an apparatus to effectively mark a defective IC die package such that such package is subsequently removed from the manufacturing process and does not make its way into the stream of commerce. The apparatus comprises a punch block assembly having a plurality of interchangeable punches and interchangeable stripper guide bushings, an interchangeable die insert and a die push pin, a punch block, an actuating means to move the die insert and die push pin from a lower inoperative position to an upper operative position; and a punch and stripper guide bushing actuating means to move the punch and the stripper guide bushing from an upper inoperative position to a lower operative position; a pair of frame locator assemblies; and a back rail supporting the punch block assembly and the lead frame locator assemblies, wherein the back rail is attached to a punch block apparatus machine base.

DETAILED DESCRIPTION OF THE INVENTION

The present invention relates to an inspection apparatus used in the manufacture of integrated circuit (IC) chips used in electronic components and apparatus. IC chips are conventionally manufactured in groups of 10 dies per lead frame.

In the prior art processes, if a die is visually identified as defective (usually due to poor lead bonding) the punch block assembly is manually activated, thereby cutting off a portion of one of the leads on the defective die. Without such lead, the die will be easily subsequently identified as defective.

Figure 1:
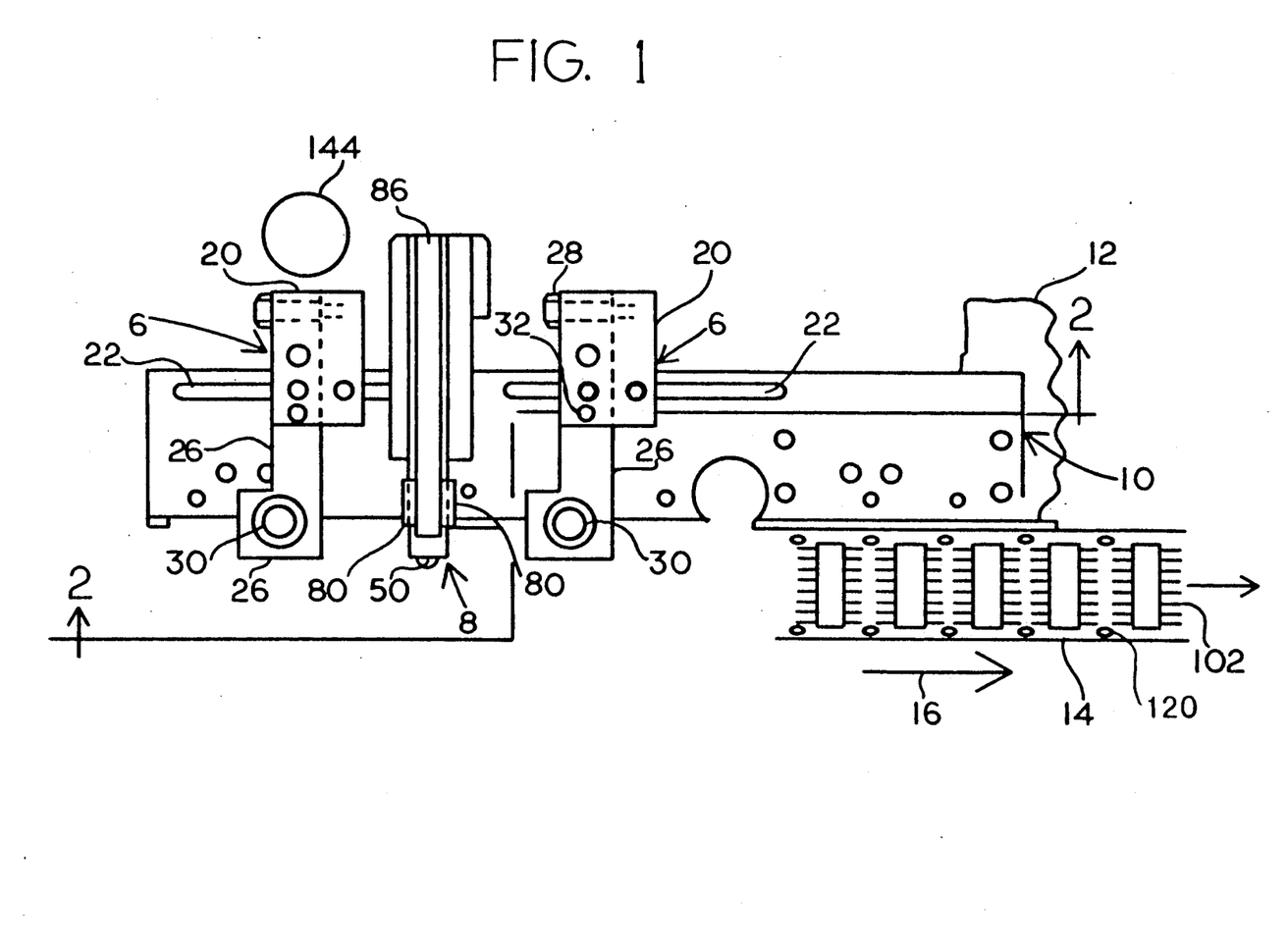
FIG. 1 is a plan view of the frame locator assembly back rail and punch block assembly.

Referring to FIG. 1, the two frame locator assemblies 6 and a punch block assembly 8 are securely fastened to back rail 10. The back rail is in turn securely affixed to the machine base 12. In the event a die is identified as defective, the punch block apparatus of the present invention is activated, marking the defective die. The die frame 14 (partially shown) is indexed forward in the direction of arrow 16 by actuating means (not shown) so that the next die 18 (FIG. 2) may be inspected and passed (not punched) or rejected (punched). The defective dies are subsequently removed in the manufacturing process.

Figure 2:
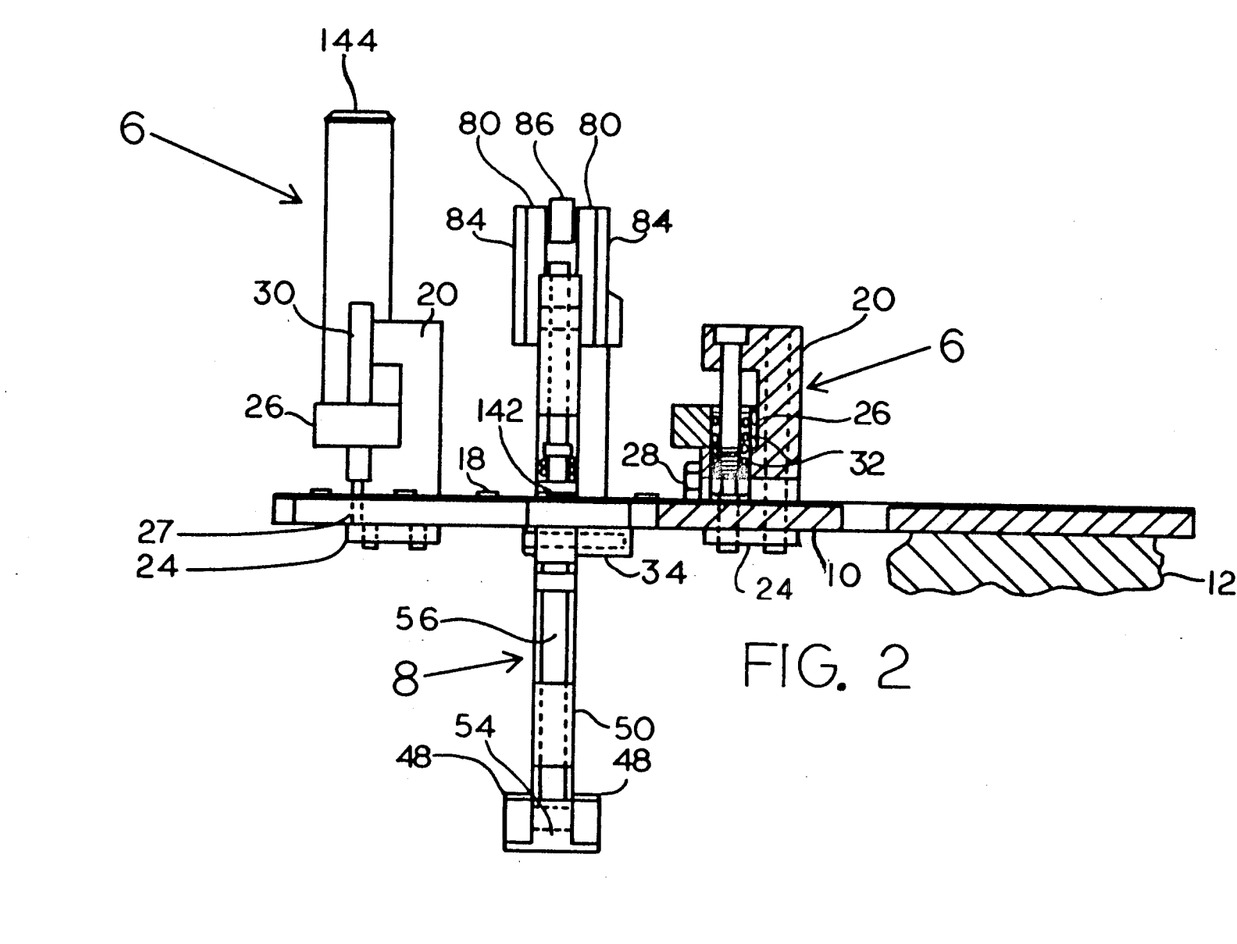
FIG. 2 is a sectional view taken along lines 2—2 of FIG. 1.

Referring to FIG. 2, the two adjustable frame locator blocks 20 are adjustably affixed through slots 22 (FIG. 1) in back rail 10, to thread into the two pinch plates 24 under the back rail 10. Frame locator arms 26 are pivotally held to the frame locator blocks 20 by a shoulder screw 28.

Each of the frame locator arms 26 guide and support a frame locator pin assembly 30. The frame locator arm 26 and frame locator pin assembly 30 and frame locator pins 27 pivot around shoulder screw 28. The frame indicator arms 26 are normally in an upper inoperative position, being raised by compression springs 32. The punch block assembly 8 is fastened by screws to a punch block mount 34 which in turn is rigidly fastened to the back rail 10.

Figure 3:
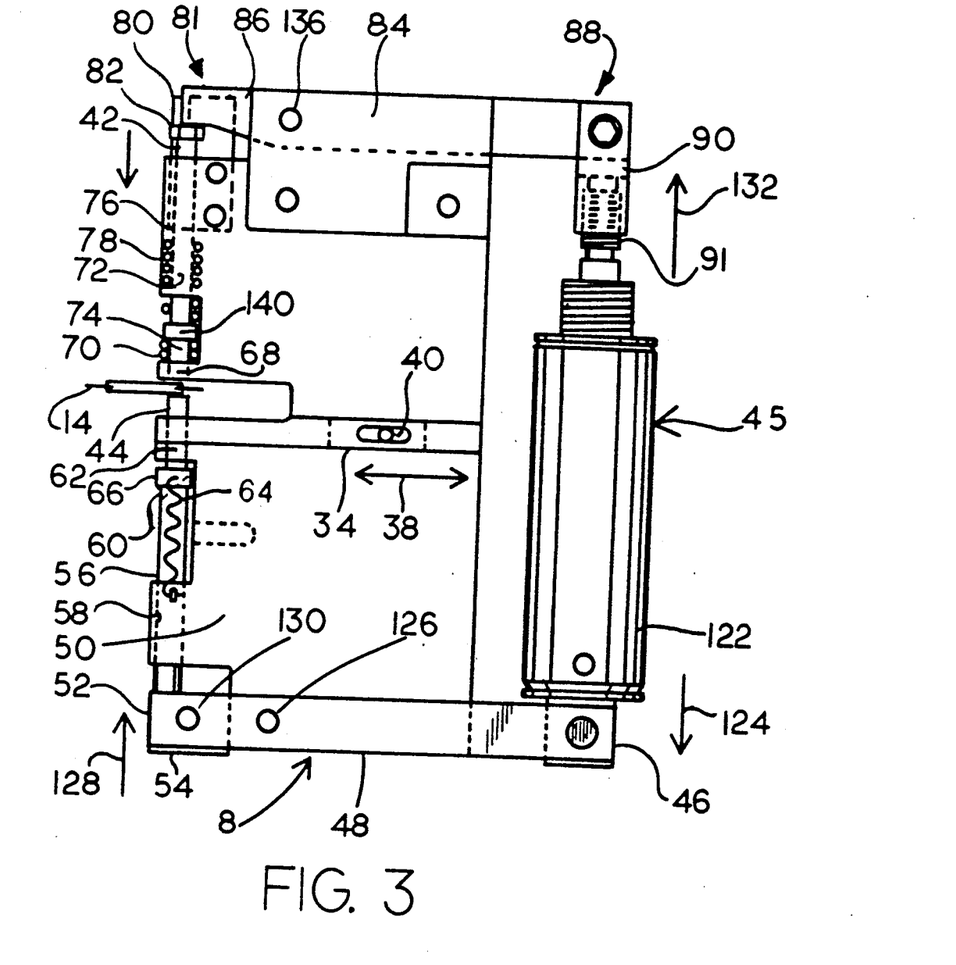
FIG. 3 is an elevation view of the punch block assembly.

Referring to FIG. 3, one of the embodiments of the invention is illustrated by punch block assembly 8 horizontal adjustability shown at arrow 38. This horizontal adjustability provides capability to select any one of four different leads that can be punched, since mounting of the punch block assembly utilizes a fastener through punch block slot 40, that fastens to punch block mount 34, indicated by phantom lines behind the punch block slot 40. As stated above, punch block mount 34 is rigidly fastened to the back rail 10, illustrated in FIG. 2.

Referring again to FIG. 3, the basic objective of the operation is to move punch 42 and stripper guide bushing 74 down until it cuts off a portion of one lead of the die frame 14 as punch 42 enters the bore of die insert 44 which previously has been raised to an upper position. The actuating means for both the raising and lowering operation is the attached air cylinder 45.

Air cylinder 45 has an air cylinder body 122, which is pinned to a first end 46 of a pair of air cylinder brackets 48. The air cylinder brackets are pivotally attached to punch block 50 and a second end of air cylinder brackets 48 is fastened to a die push pin pad 54. Die push pin pad 54 supports a die push pin 56 and die insert 44. The vertical, cylindrical die push pin 56 is inserted into a first in-line bore cavity 58 of punch block 50 and is provided with a slot 60 at its top. Slot 60 provides an exit for the punched lead chip from the die lead that has dropped down through the die insert 44 after punching operation. Die insert 44, is inserted into a second in-line bore cavity 62 and rests on top of the die push pin 56. Die insert 44 is held in a down position by tension springs 64 which have end connections at a shoulder 66 of the die insert 44 and the punch block 50. A stripper guide bushing 74 is inserted into a third in-line bore cavity 68 of punch block 50 and is vertically supported to an inoperative upper position by lifter spring 70. Punch 42 is inserted into a fourth in-line bore cavity 72 of the punch block 50 and then is inserted into a cylindrical bore in stripper guide bushing 74. An upper section 76 of punch 42 is vertically supported by punch stripper spring 78. Punch 42 is held in proper radial orientation (prevented from rotating) by a pair of punch orienting guides 80, one of which is shown in FIG. 3. A first end 81 of pivot arm 86 rests on the head 82 of punch 42. A pair of pivot brackets 84 provide pivotal support to pivot arm 86 and a second end 88 of the pivot arm 86 attaches to a clevis 90 which in turn is fastened to a piston 91 of air cylinder 45. It should be noted that air cylinder 45 could be inverted to have the air cylinder body 122 connect to the clevis 90 and the air cylinder piston connect 91 to the air cylinder bracket 48 without changing or affecting operation.

Figure 4:
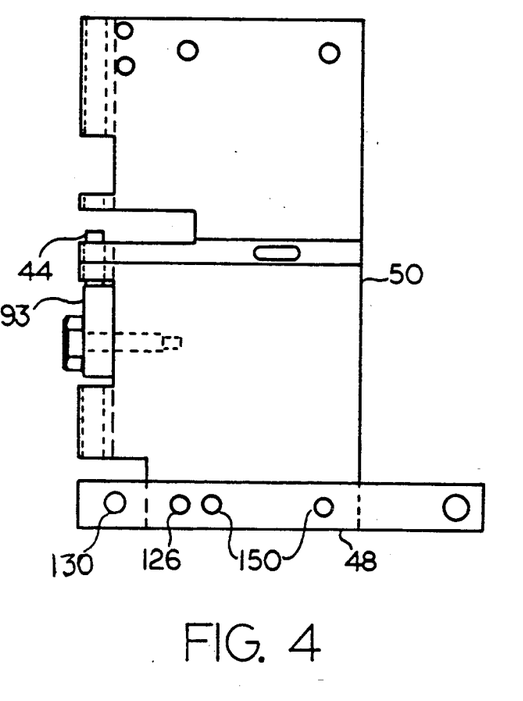
FIG. 4 is a side view of a variation of the punch block.
Figure 9:
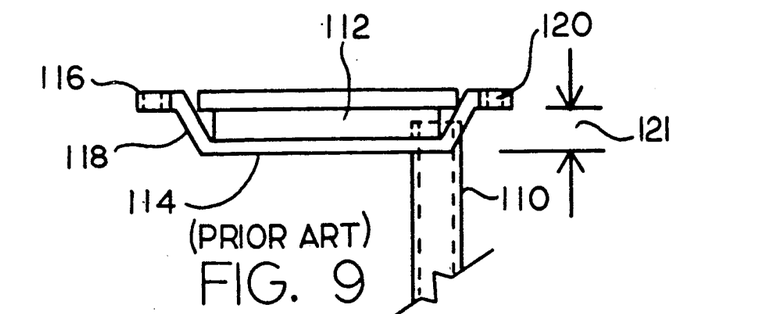
FIG. 9 is a section view of prior art the die frame in the punch position.

Referring to FIG. 4 the punch block 50 is drilled and tapped at aperture 150 and bolts may be inserted through the air cylinder brackets 48 and punch block 50, thereby maintaining the air cylinder brackets 48, die push pin 56 and die insert 44 in a fixed upper position, if desired. Alternatively, the die keeper 93 may be bolted to the punch block 50, which in turn maintains die insert 44 in a fixed up position. The fixed up position of the die insert 44 may be used on specific die frames that do not have a down set condition as illustrated in FIG. 9 and described later. The down set creates an interference between the die insert and the die frame when the die frame is indexed forward.

Figures 5A, 5B, 6A, 6B:
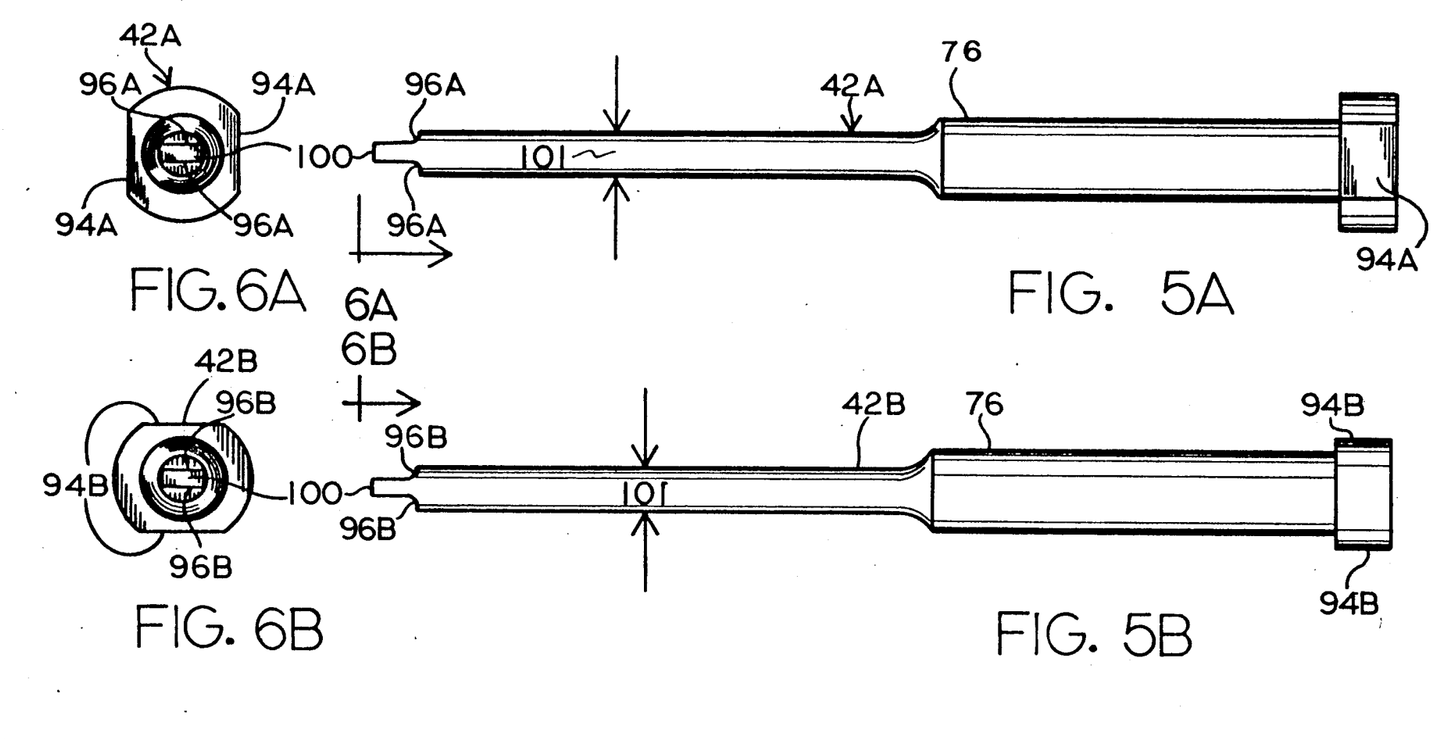
FIGS. 5A and 5B are side views of the punches.
FIGS. 6A and 6B are end views of the punch tips.
Figure 10:
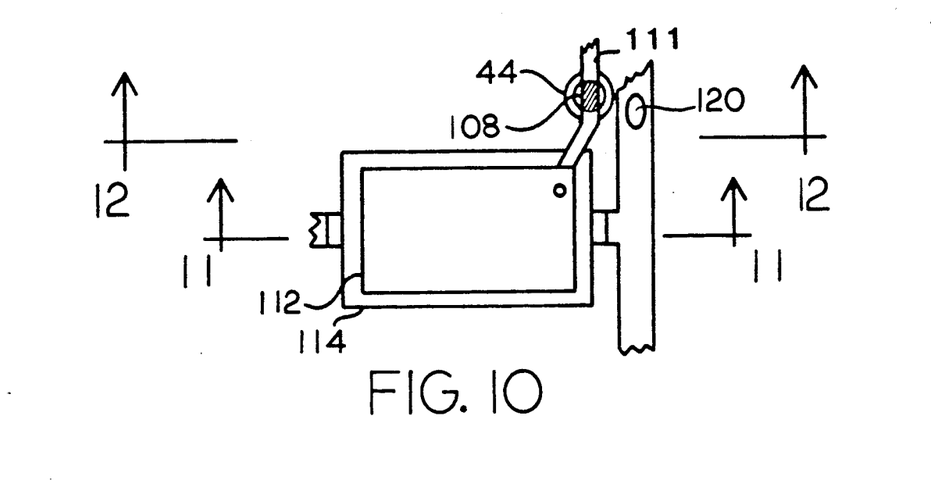
FIG. 10 is a plan view of the die frame of the present invention in the punch position.

It is to be understood that while two punches are illustrated in FIGS. 5A and 5B, three or more may be provided as needed. Punches 42 are provided with punch head flats 94A and 94B, as illustrated on the head end of the punch 42. As set forth above, punch head flats 94A and 94B are a mating surface to the punch orienting guides 80 illustrated in FIGS. 1, 2 and 3 and serve to maintain punch 42 in a fixed radial position such that punch tip flats 96A and 96B (FIG. 6) are aligned with the die lead 98 (FIG. 10). Another feature of the punch is the larger diameter upper section 76 near the punch head. This larger section provides a bearing surface for the punch stripper spring 78 (FIG. 3) that raises the punch to an upper inoperative position. Its operation will be fully described later. The lower section of the punch near the tip 100 has a body diameter 101 of either 0.1 inches or 0.125 inches. Punch tips 100 may be machined to any convenient shape, such as a rectangular shape, by grinding the punch tip at point 96 on each punch to yield a dimension of, for example, 0.040 inches across the flat opposing surfaces. This 0.040-inch dimension approximates the width of the die frame lead that is being punched.

Referring to FIGS. 6A and 6B, it can be noted that on punch 42A the orientation of the punch tip flats 96A are rotated 90° from punch head flat 94A, whereas on punch 42B the punch tip flat 96A is parallel to the punch head flat 94B.

This 90° rotation on punch 44B provides the ability to punch the end leads (not shown) of a plastic leaded chip carrier (PLCC), as opposed to the side leads 102 which are shown on FIG. 1. Side leads are punched on PLCC's since that is the location for pin 1, the preferred lead for punching.

Figure 7:
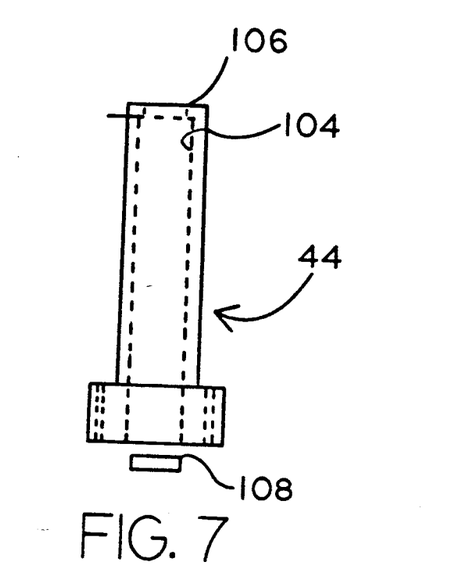
FIG. 7 is a side view of the die insert.

FIG. 7 illustrates the configuration of commercially available, interchangeable and modified die inserts. Die inserts 44 are unique in that they are provided with counter bore 104, which is slightly larger than the diameter of the main body bore 106. The counter bore may be tapered. Die inserts permit easy passage of a punched lead chip 108 through the die insert 44 after punching as illustrated in FIG. 7.

Figure 8:
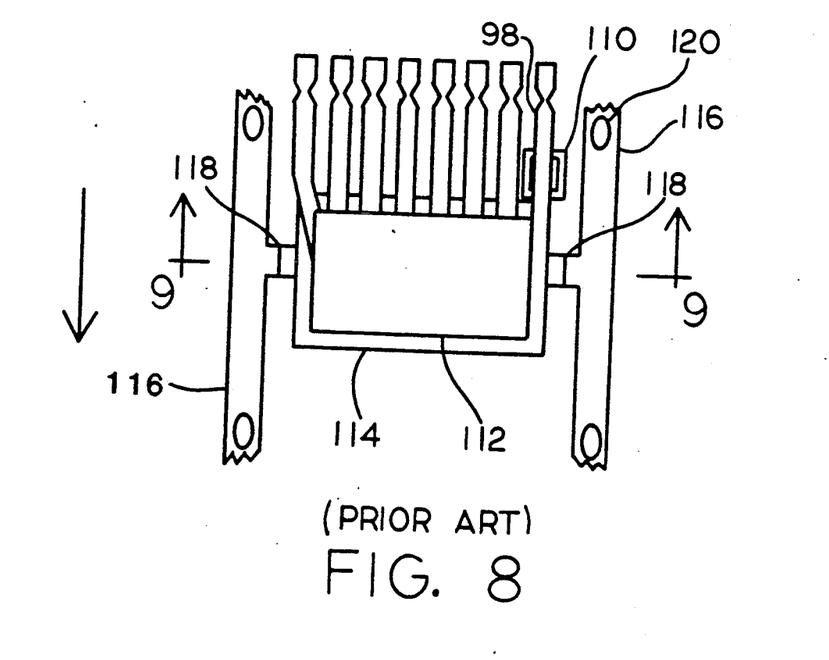
FIG. 8 is a plan view of a prior art die frame in the punch position.

FIG. 8 illustrates a die frame in the punch position wherein the prior art (rectangular punch) die insert 110 is in a fixed position below pin one die lead 98. FIG. 8 illustrates the proximity of the die insert 110 to the die 112 which is glued to die pad 114, and the attachment of die pad 114 to die frame rail 116 by means of web 118. As illustrated, the die 112 and die pad 114 are larger in size than other typical semiconductor devices, creating an interference between the die insert 110 and the die pad 114 or the die 112. FIG. 8 also shows a typical die frame index hole 120 which mates with an indexing pin used to provide linear motion to the die frame rail 116.

FIG. 9, a section view through FIG. 8, illustrates the interference problem that previously occurred when attempting to punch die frame leads on larger dies 112 and die pads 114. The die 112 and die pad 114 have a downset displacement dimension 121 wherein the die 112 and die pad 114 are both set in a plane lower than the die frame rail 116. Interference occurs during linear motion of the die frame rail 116 as it is moved by the indexing pin (not shown) that is inserted into die frame index hole 120. The design of the universal punch block of the present invention eliminates the interference between fixed die insert 110 and die pad 114 when the die 112 and die pad 114 are manufactured with a downset 121. This interference is eliminated by making the die insert 44 moveable in the vertical direction wherein the die insert 44 is in a lower inactive position while the die frame rail 116 is being indexed forward, and the die insert 44 is raised whenever a punching operation is carried out.

FIG. 10 illustrates in plan view the die insert 44 in a position below the pin one die lead 111 and the approximate size of the rectangular punched lead chip 108 (cross-hatched).

Figure 11:
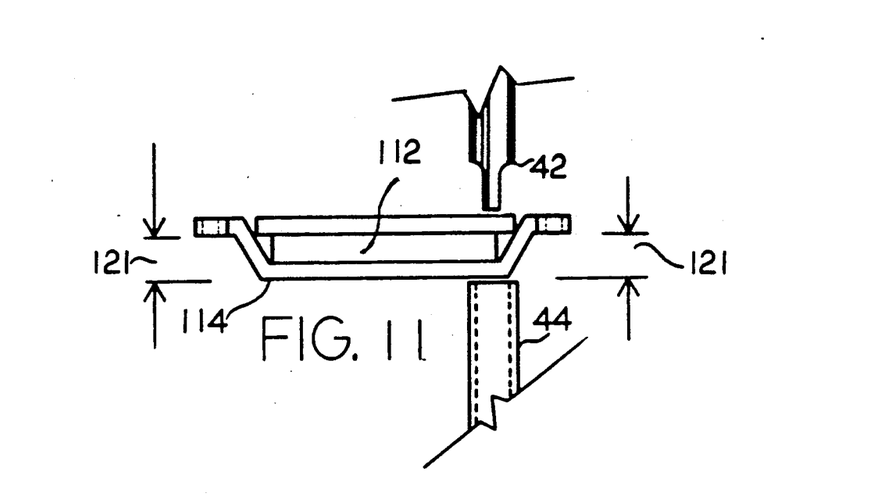
FIG. 11 is a section view of the die frame of the present invention in the punch position.

FIG. 11 is a section view through FIG. 10 and illustrates how the interference problem set forth above is corrected. In FIG. 11 die insert 44 is shown in the lower inactive position needed to avoid die pad 114 during indexing. There is clearance between die insert 44 and die pad 114 even though the die pad 114 has a downset 121. Also illustrated is the punch 42 in the inoperative up position.

Figure 12:
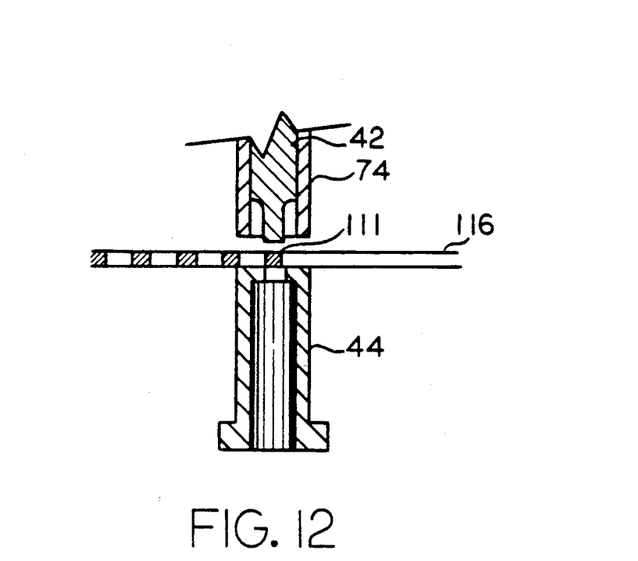
FIG. 12 is a section view of the die frame of the present invention in the punch position with the die insert in the upper operative position.

FIG. 12 illustrates in section view the relationship of the die insert 44 to the die frame rail 116 and pin one die lead 111 prior to actual punch 42 and stripper guide bushing 74 down motion. The die insert 44 is in the upper operative position and supports the pin one die lead 111. It is important that the die insert 44 be in this position prior to punch 42 down motion to support the die lead 111 as the punch 42 enters the die insert 44. Simultaneously motion of both punch 42 and die insert 44 would force the die lead 111 down and distort the lead frame that the die lead 111 attaches to possibly causing an improper punch.

Figure 13:
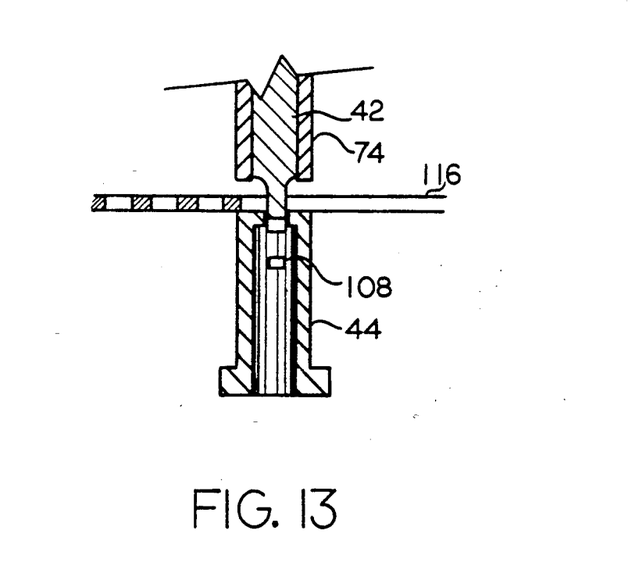
FIG. 13 is a section view of the die frame of the present invention in the punch position with the die insert in the upper operative position and the punch in the lower operative position (during lead punch).

FIG. 13 illustrates in section view the die insert 44 in the upper operative position and the punch 42 and stripper guide bushing 74 in the lower operative position whereby the punch 42 has entered the die insert bore 106 (FIG. 7) and is punching out a punched lead chip 108.

The operation of the punch block assembly will be described by reference to FIG. 3 unless otherwise stated. Die frame 14 is positioned by an indexing means (not shown), well-known to those skilled in this art, to a position between punch 42 and die insert 44. After visual inspection by an inspector, if a readily visible defect is observed, such as a poor bond, the inspector activates air cylinder 45 thereby extending the air cylinder body 122 downwardly as shown by arrow 124. A first end 46 of air cylinder bracket 48 pivots downwardly about bracket pivot point 126. A second end 52 of air cylinder bracket 48 pivots upwardly in the direction of arrow 128 about pivot point 126. Die push pin pad 54 is pivotally affixed to air cylinder brackets 48 at 130, and raises die push pin 56 and die insert 44 to an upper operative position adjacent the bottom of die frame 14. Upward motion of the die insert 44 is stopped by a shoulder 66 on the bottom of die insert 44. On completion of the downward movement of cylinder body 122, the piston 92 and clevis 90 are disposed upwardly. This sequence occurs since the tension springs 64 on the die insert 44 are weaker than the punch stripper spring 78, and the air cylinder body 122 motion completes before the piston 92 begins to move upward. This action, shown by arrow 132, causes upward motion of the second end 88 of the pivot arm 86, which is pivotally connected to punch block 50 assembly at 136. The first end 81 of pivot arm 86 is thereby forced downward thereby pushing punch 42 down. Downward motion of punch 42 compresses punch stripper spring 78, which in turn pushes stripper guide bushing 72 down until a shoulder 140 on the stripper guide bushing 72 has fully compressed the lifter spring 70 against the punch block 50. Punch 42 continues down to the lower operative position and shears off the die lead 111 (FIG. 10) on die frame 114 as it enters the circular cavity of die insert 44. The small punched lead chip 108 (FIG. 10) drops through the die insert 44 (FIG. 7) and exits through the slot 60 in the die push pin 56. At the end of the punch 42 stroke, a limit switch (not shown) attached to punch block assembly 8 activates an indicator means to indicate a completed punch stroke to the inspector. On completion of this stroke, the air cylinder piston 92 is automatically deactivated and restored by internal springs to the down position and tension springs 64 pull the die insert 44 and die push pin 56 to the lower inoperative position to rest on the die push pin pad 54. Simultaneously, lifter spring 70 restores stripper guide bushing 76 to its upper inoperative position and punch stripper spring 78 restores punch 42 to the upper inoperative position where it contacts the first end 138 of the pivot arm 86. Die frame 14 is now ready to be moved to the next die position by the indexing means.

FIG. 1 illustrates the location of the frame locator assemblies 6. It is to be understood that continuous die frame 14 having generally ten dies, extends the entire length of back rail 10 (only a partial section has been shown holdinq four dies). It is also to be understood that the die frame 14 has been properly positioned against the of back rail 10 and that both frame locator assemblies 6 have also been properly positioned such that frame locator pin assemblies 30 are centered over two separate index holes 120. By adjusting the frame locator assemblies 6 in the locator block slots 29 the die frame 14 may be properly positioned.

Operation of the frame locator assembly will now be described by reference to FIG. 2 unless otherwise stated. With a die 142 located in position under the punch block when an inspector identifies a bonding defect in die 142, operator action causes the frame locator air cylinder 144 to depress the frame locator arms 26 to the lower operative position as shown. Frame locator arms 26 are pivotally connected to frame locator blocks 20 by shoulder screws 28 to allow this downward rotation. If the die frame 14 is properly located, the frame locator pins 27 will pass through die frame index holes 120 (FIG. 1) and the punch block assembly 8 will operate and punch a die lead as set forth above. On completion of the punch operation, the frame locator arms 26 are released from their operative position as shown, and compression spring 32 restores them to an upper inoperative position so that the die frame 14 can be indexed forward in order to inspect the next die 18.

The following table identifies which pieces are used when inspecting different products and demonstrates the adaptability to a whole range of products including ZIP, SIP, SOJ, DIP and PLCC. This adaptability is accomplished by using a series of only three punches 42, two die inserts 44 and two stripper guide bushings 74 the die insert and stripper guide bushings used with each punch match the punch body diameter. Table 1 illustrates the punches used on various products.

TABLE 1

| Punch Body Diameter | Punch Piece No. (FIG. 5) | Used on Products |
|---|---|---|
| 0.100 | 42A | SIP, ZIP, SOJ, DIP, PLCC (side) |
| 0.125 | 42A | SOJ, DIP, PLCC (side) |
| 0.100 | 42B | PLCC (end) |

*PLCC (side) leads are those that connect as shown in FIG. 8. Whereas PLCC (end) leads are those that connect to die frame rail (not shown).

The universal punch block apparatus allows adjustability in punch location, typically from pin one to pin four on an eight-pin DIP, adjustability parallel to the die frame rails to punch a PLCC end lead, and adjustability for different spacing between die frame index holes. It can be seen from the punch diameter data that second punch 42B is used to punch a longer lead chip than that of punch 42A, since it is 0.025 inches larger in diameter. The apparatus of the present invention provides more stability and smoother punch operation, and provides more accurate indexing of frame locator arm assemblies. The use of a vertically moveable die insert below the punch allows punching of products that have a large die and die pad in conjunction with a downset of the die pad.

While a preferred embodiment of the invention has been disclosed, various modes of carrying out the principles disclosed herein are contemplated as being within the scope of the following claims. Therefore, it is understood that the scope of the invention is not to be limited except as otherwise set forth in the claims.

We claim:

1. A punch block apparatus for removing a portion of an integrated circuit (IC) die lead from a lead frame such that when the absence of the removed IC die lead is noted said IC die is rejected, comprising:
   a. a machine base;
   b. a back rail mounted to the machine base;
   c. a punch block assembly mounted on the back rail and further comprising:
      i. a punch block;
      ii. a slotted die push pin mounted within a first bore of the punch block;
      iii. a die insert mounted within a second bore of the punch block aligned with the first bore and above the push pin;
      iv. an actuating means to move the die insert and die push pin from a lower inoperative position to an upper operative position;
      v. a stripper guide bushing mounted within a third bore of the punch block aligned with the first bore above the die insert;
      vi. a punch within a fourth bore of the punch block aligned with the first bore and interfitting within the stripper guide bushing;
      vii. a punch and stripper guide bushing actuating means to move the punch and the stripper guide bushing from an upper inoperative position to a lower operative position; and
   d. a pair of frame locator assemblies mounted above the back rail, whereby a punch tip interfits within a die insert bore thereby removing the die lead portion when the punch is in the lower operative position and the die insert is in the upper operative position.

2. The apparatus of claim 1, the die insert and die push pin actuating means and the punch and stripper guide actuating means, further comprising:
   a. an air cylinder body pivotally connected to a first end of a pair of air cylinder brackets;
   b. a bracket pivot point pivotally supporting the air cylinder brackets from the punch block assembly;
   c. the slotted die push pin supported by a second end of the air cylinder brackets, the die push pin being in pushing engagement with the interchangeable die insert;
   d. a first end of a pivot arm being in pushing engagement with the punch and an air cylinder piston pivotally connected to a second end of the pivot arm; and
   e. a pivot arm connection pivotally connecting the pivot arm to the punch block assembly.

3. The apparatus of claim 2, wherein the air cylinder body moves to a downward operative position and the air cylinder piston moves in an opposite direction to an upward operative position, and the air cylinder piston is retracted to an inoperative position by internal spring means.

4. The apparatus of claim 3, wherein means is provided to move the air cylinder body to the downward operative position prior to the air cylinder piston moving to the upward operative position, thereby moving the die insert to the upper operative position before moving the punch and stripper guide to the lower operative position.

5. The apparatus of claim 4, wherein the means to move the cylinder body prior to moving the air cylinder piston comprises:
   a. a pair of tension springs that restore the die insert from the upper operative position to a lower inoperative position; and
   b. a punch stripper spring that restores the punch from a lower operative position to an upper inoperative position wherein a spring force exerted by the tension springs is less than a spring force exerted by the punch stripper spring thereby causing a first upward motion of the die insert until stopped by a shoulder on the die insert, and then a second downward motion of the punch.

6. The apparatus of claim 1, further comprising:
   a. a punch tip end inserted into a bore of the stripper guide bushing;
   b. a punch stripper spring compressed between a section of the punch and an end section of the punch stripper guide, whereby motion of the punch from the upper inoperative position to the lower operative position causes downward motion of the punch stripper guide, and the punch stripper spring restores the punch to the upper inoperative position on deactivation of the punch actuating means;
   c. a lifter spring compressed between the stripper guide bushing and the punch block, whereby the stripper guide bushing is restored to the upper inoperative position sequentially after the punch is restored to the upper inoperative position, thereby stripping off a punched lead chip.

7. The apparatus of claim 1, wherein a pair of punch orienting guides attach to a top section of the punch block and straddle a punch head end flat section of the punch, thereby providing a proper radial orientation to the punch.

8. The apparatus of claim 1, wherein the punch, further comprises:
   a. a punch head end that has been machined to have a punch head flat on two opposing sides; and
   b. a punch tip end that has been machined to have a punch tip flat surface on two opposing sides.

9. The apparatus of claim 8, comprising:
   a. a first and second punch machined such that the punch tip end flat surfaces are perpendicular to the punch head end flat surfaces;
   b. a third punch having a punch tip end flat surface parallel to the punch head end flat surface; wherein the first and third punches have a body diameter of 0.100 inches and the second punch has a body diameter of 0.125 inches.

10. The apparatus of claim 1, wherein the interchangeable die insert is interchangeable and comprises a pair of cylindrical die inserts having cylindrical bores counterbored and tapered allowing passage of an IC die punched lead therethrough.

11. The apparatus of claim 10, wherein the die insert counterbores are 0.125 and 0.150 inches respectively and the taper of each is between 0.004 and 0.006 inches per inch of bore.

12. The apparatus of claim 10, wherein the punches may be used to punch a die lead selected from the group of IC die devices consisting essentially of SIP, ZIP, SOJ, DIP and PLCC.

13. The apparatus of claim 1, wherein the pair of frame locator assemblies comprise:
   a. a pair of frame locator blocks adjustably fastened to the back rail;
   b. a pair of frame locator arms pivotally attached to the frame locator blocks;
   c. a frame locator arm actuating means to pivot the frame arms from an upper inoperative position to a lower operative position;
   d. a compression spring compressed between a cavity in the frame locator block and a bottom of the frame locator arm, whereby the frame locator arm is restored to the upper inoperative position by the spring on deactivation of the frame locator arm activating means; and
   e. a frame locator pin assembly fastened to the frame locator arm.

14. The apparatus of claim 1, wherein the back rail comprises:
   a. a rectangular plate with a pair of slots running parallel to a long side of the back rail such that adjustability of the frame locator assemblies is provided by the use of a fastening means through the slots;
   b. fastener means to adjustably support the punch block whereby adjustment of the punch block perpendicular to the long side of the back rail is provided; and
   c. fastening means to rigidly attach the back rail to the punch block apparatus machine base.

15. A punch block apparatus for removing a portion of an integrated circuit (IC) die lead from a lead frame such that when the absence of the removed IC die lead is noted said IC die is rejected, comprising:
   a. a machine base;
   b. a back rail mounted to the machine base;
   c. a pair of frame locator assemblies mounted above the back rail;
   d. a punch block assembly mounted on the back rail and further comprising:
      i. a punch block;
      ii. a slotted die push pin mounted within a first bore of the punch block;
      iii. a die insert mounted within a second bore of the punch block aligned with the first bore and above the push pin;
      iv. an actuating means to move the die insert and die push pin from a lower inoperative position to an upper operative position;
      v. a stripper guide bushing mounted within a third bore of the punch block aligned with the first bore above the die insert;
      vi. a punch within a fourth bore of the punch block aligned with the first bore and interfitting within the stripper guide bushing; and
      vii. a punch and stripper guide bushing actuating means to move the punch and the stripper guide bushing from an upper inoperative position to a lower operative position, wherein the actuaring means to move the die insert and die push pin from the lower inoperative position to the upper operative position precedes the actuating means to move the punch and stripper guide bushing from the upper inoperative position to the lower operative position causing the punch to enter a bore of the die insert, thereby removing the portion of the IC die lead.

* * * * *